(12) United States Patent
Yoshikawa et al.

(10) Patent No.: US 11,114,248 B2
(45) Date of Patent: Sep. 7, 2021

(54) THIN FILM CAPACITOR AND MANUFACTURING METHOD THEREOF

(71) Applicant: TDK Corporation, Tokyo (JP)

(72) Inventors: Kazuhiro Yoshikawa, Tokyo (JP); Daiki Ishii, Tokyo (JP); Kenichi Yoshida, Tokyo (JP)

(73) Assignee: TDK Corporation, Tokyo (JP)

( * ) Notice: Subject to any disclaimer, the term of this patent is extended or adjusted under 35 U.S.C. 154(b) by 104 days.

(21) Appl. No.: 16/354,373

(22) Filed: Mar. 15, 2019

(65) Prior Publication Data
US 2019/0287726 A1    Sep. 19, 2019

(30) Foreign Application Priority Data
Mar. 19, 2018    (JP) .............................. JP2018-051073

(51) Int. Cl.
*H01G 4/33*    (2006.01)
*H01G 4/012*    (2006.01)

(52) U.S. Cl.
CPC .............. *H01G 4/33* (2013.01); *H01G 4/012* (2013.01)

(58) Field of Classification Search
CPC ....................................................... H01G 4/33
See application file for complete search history.

(56) References Cited

U.S. PATENT DOCUMENTS

| | | | |
|---|---|---|---|
| 2013/0194714 A1* | 8/2013 | Nakaiso | H01L 23/5252 361/301.2 |
| 2016/0071651 A1* | 3/2016 | Kurosawa | H01G 4/306 361/304 |

FOREIGN PATENT DOCUMENTS

| | | |
|---|---|---|
| JP | 2014-90077 A | 5/2014 |
| WO | WO-2006/117912 A1 | 11/2006 |

* cited by examiner

*Primary Examiner* — Eric W Thomas
(74) *Attorney, Agent, or Firm* — Faegre Drinker Biddle & Reath LLP

(57) ABSTRACT

A thin film capacitor includes a capacitance portion in which a plurality of electrode layers and dielectric layers are alternately laminated, a cover layer, an insulating layer, a via hole in which one electrode layer different from an uppermost electrode layer among the plurality of electrode layers is exposed at a bottom surface thereof, and an opening which is provided inside the via hole and in which the one electrode layer is exposed at a bottom surface thereof, and in which the cover layer and the insulating layer are exposed at a side surface. The opening includes a first opening portion which passes through the insulating layer and a second opening portion which is provided below the first opening portion and passes through the cover layer, and when an inner diameter of the first opening portion is D1 and an inner diameter of the second opening portion is D2, D1>D2.

5 Claims, 6 Drawing Sheets

THIN FILM CAPACITOR AND MANUFACTURING METHOD THEREOF

TECHNICAL FIELD

The present invention relates to a thin film capacitor and a manufacturing method thereof.

BACKGROUND

Conventionally, a thin film capacitor in which a capacitor is laminated on a base material has been proposed. In the thin film capacitor, it is conceivable to laminate an electrode layer and a dielectric layer, which will be a capacitance portion, on a substrate and then to provide a protective layer (an insulating layer) formed of an organic material such as a resin or the like above the capacitance portion (refer to, for example, PCT International Publication No. WO2006/117912 and Japanese Unexamined Patent Publication No. 2014-90077).

SUMMARY

However, the insulating layer may contain unreacted products. When water, hydrogen or the like is generated from these unreacted products, there is a possibility that the water, hydrogen or the like may diffuse from the insulating layer to the dielectric layer. When the water, hydrogen or the like reaches the dielectric layer, there is a possibility that performance of the capacitance portion may deteriorate.

The present invention has been made in view of the above problem, and an object thereof is to provide a thin film capacitor and a manufacturing method thereof in which performance degradation of a capacitance portion derived from unreacted products contained in an insulating layer is prevented.

According to one embodiment of the present invention, there is provided a thin film capacitor including a capacitance portion in which a plurality of electrode layers and dielectric layers are alternately laminated in a laminating direction, a cover layer laminated on the capacitance portion, an insulating layer laminated on the cover layer, a via hole which extends in the laminating direction and in which one electrode layer different from an uppermost electrode layer among the plurality of electrode layers is exposed at a bottom surface thereof, and an opening which extends in the laminating direction and is provided inside the via hole and in which the one electrode layer is exposed at a bottom surface thereof, and in which the cover layer and the insulating layer laminated on the one electrode layer are exposed at a side surface in this order, wherein the opening includes a first opening portion which passes through the insulating layer and a second opening portion which is provided below the first opening portion and passes through the cover layer, and when an inner diameter of the first opening portion is D1 and an inner diameter of the second opening portion is D2, $D1>D2$.

Also, according to one embodiment of the present invention, there is provided a manufacturing method of a thin film capacitor including a laminating step of alternately laminating a plurality of electrode layers and dielectric films in a laminating direction and forming a laminated body, a via hole forming step of forming a via hole extending in the laminating direction with respect to the laminated body and exposing one electrode layer different from an uppermost electrode layer of the plurality of electrode layers at a bottom surface of the via hole, a baking step of baking the laminated body, forming a dielectric layer from the dielectric film and thus forming a capacitance portion, a protective layer laminating step of laminating a cover layer and an insulating layer in this order on the laminated body, an opening forming step of forming an opening extending in the laminating direction inside the via hole, exposing the one electrode layer at a bottom surface thereof and exposing the cover layer laminated on the one electrode layer and the insulating layer laminated on the cover layer at a side surface thereof, and a surface treatment step of peeling off a surface layer of the insulating layer and forming a first opening portion passing through the insulating layer and a second opening portion provided below the first opening portion and having an inner diameter smaller than that of the first opening portion and passing through the cover layer inside the opening.

According to the thin film capacitor and the manufacturing method thereof, in the opening in which one electrode layer is exposed at the bottom surface thereof, the inner diameter D1 of the first opening portion passing through the insulating layer and the inner diameter D2 of the second opening portion provided below the first opening portion and passing through the cover layer satisfy the relationship of $D1>D2$. With such a configuration, it is possible to secure a long connection path between the dielectric layer forming the capacitance portion covered with the cover layer and the insulating layer laminated above the cover layer. Therefore, even when water, hydrogen, or the like is generated from unreacted products contained in the insulating layer, these components can be prevented from reaching the dielectric layer, and thus it is possible to prevent performance deterioration of the capacitance portion due to the unreacted products contained in the insulating layer.

Here, the cover layer may include a first cover layer, and a second cover layer formed of an inorganic insulating material and laminated on the first cover layer.

As described above, since the cover layer includes the first cover layer and the second cover layer formed of the inorganic insulating material laminated on the first cover layer, the first cover can increase adhesion between the first cover layer and the inner capacitance portion, and the second cover layer can ensure a long path between the insulating layer laminated on the second layer and the dielectric layer of the capacitance portion. Therefore, performance deterioration of the capacitance portion due to the unreacted products contained in the insulating layer can be prevented, and damage of the thin film capacitor or the like around the cover layer can be appropriately prevented.

Further, the second opening portion may include an upper opening portion which passes through the second cover layer and a lower opening portion which passes through the first cover layer, and when an inner diameter of the upper opening portion is D21 and an inner diameter of the lower opening portion is D22, $D1>D21>D22$.

As described above, in the second opening portion, when the inner diameter D21 of the upper opening portion passing through the second cover layer and the inner diameter D22 of the lower opening portion passing through the first cover layer satisfy $D1>D21>D22$, it is possible to secure a longer path between the insulating layer and the dielectric layer of the capacitance portion. Therefore, it is possible to prevent performance deterioration of the capacitance portion due to the unreacted products contained in the insulating layer.

According to the present invention, a thin film capacitor and a manufacturing method thereof in which performance degradation of a capacitance portion derived from unreacted products contained in an insulating layer is prevented are provided.

DETAILED DESCRIPTION

Figure 1:
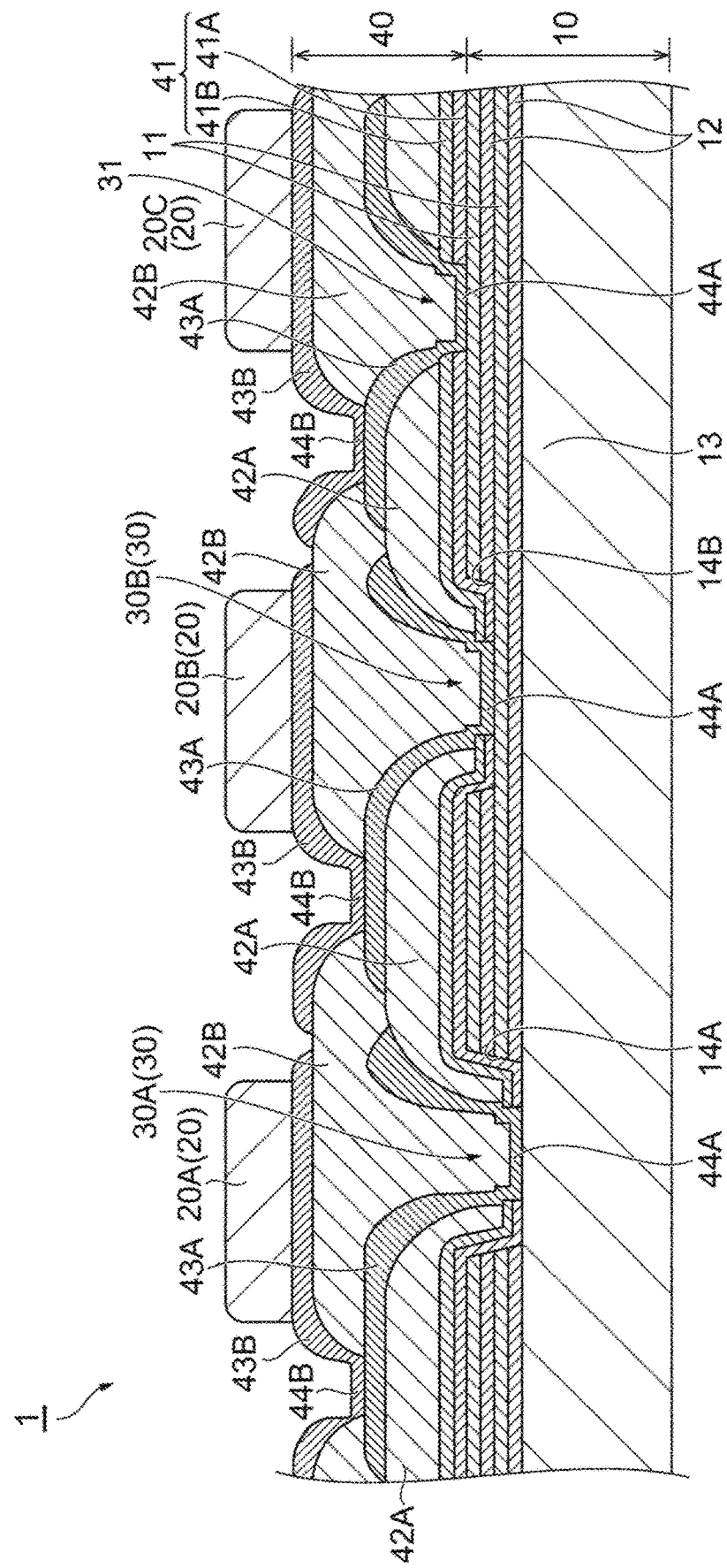
FIG. 1 is a cross-sectional view schematically showing a part of a thin film capacitor according to an embodiment of the present invention.

Hereinafter, embodiments for implementing the present invention will be described in detail with reference to the accompanying drawings. In the description of the drawings, the same elements are designated by the same reference numerals, and duplicate descriptions thereof will be omitted.

FIG. 1 is a cross-sectional view schematically showing a part of a thin film capacitor according to an embodiment of the present invention. As shown in FIG. 1, the thin film capacitor 1 has a capacitance portion 10 as a capacitor structure and also has electrode terminals 20 (20A, 20B, and 20C) as electrode terminals drawn from the capacitance portion 10. A wiring portion 40 which electrically connects the capacitance portion 10 to the electrode terminals 20 is provided between the capacitance portion 10 and the electrode terminals 20.

In the specification, a "laminating direction" is a direction in which layers, such as the capacitance portion 10, the wiring portion 40 and the electrode terminals 20, sequentially overlap from the capacitance portion 10 toward the electrode terminals 20. Further, in the following description, the side of the electrode terminal 20 may be referred to as "the upper side" in the laminating direction, and the side of the capacitance portion 10 may be referred to as "the lower side" in the laminating direction.

The capacitance portion 10 includes a plurality of internal electrode layers 11 provided in the laminating direction, a dielectric layer 12 sandwiched between the internal electrode layers 11, and a base electrode layer 13 on which the plurality of internal electrode layers and the dielectric layer 12 are laminated. The internal electrode layers 11 and the dielectric layer 12 are alternately laminated on the base electrode layer 13 in the order of the dielectric layer 12 and the internal electrode layer 11. In the embodiment, the capacitance portion 10 has a multilayer structure including the base electrode layer 13, two internal electrode layers 11, and two dielectric layers 12. In the following description, the internal electrode layer 11 and the base electrode layer 13 may be collectively referred to as an "electrode layer."

The capacitance portion 10 has a plurality of regions in which each of the internal electrode layers 11 and the dielectric layers 12 is partially removed. Therefore, a via hole 14 extending in the laminating direction in which the internal electrode layers 11 and the dielectric layers 12 are laminated is formed in the capacitance portion 10. The via hole 14 passes through at least one internal electrode layer 11 and one dielectric layer 12. In the via hole 14, one of the plurality of internal electrode layers 11 or the base electrode layer 13 is exposed at a bottom surface of the via hole 14. In FIG. 1, two via holes 14 (14A and 14B) are shown, the base electrode layer 13 is exposed at the bottom surface in one via hole 14A, and the lower internal electrode layer 11 of the two internal electrode layers 11 is exposed at the bottom surface in the other via hole 14B. Further, the internal electrode layer and the dielectric layer above the electrode layer exposed at the bottom surface are exposed at the side surfaces of the via holes 14A and 14B. In addition, a first wiring layer 43A which will be described later is disposed to cover the bottom surfaces and the side surfaces of the via holes 14A and 14B. As a result, the base electrode layer 13 and the internal electrode layer 11 are connected to the first wiring layer 43A to be described later at the exposed surfaces in each of the openings. With such a structure, a multilayer capacitor structure is formed in the capacitance portion 10.

A first insulating layer 42A of the wiring portion 40 and cover layers (a first cover layer 41A and a second cover layer 41B) which will be described later are laminated inside the via holes 14A and 14B. As a result, openings 30 (openings 30A and 30B) in which the first wiring layer 43A is laminated on bottom surfaces and side surfaces thereof are formed inside the via holes 14A, 14B.

The uppermost internal electrode layer 11 closest to the electrode terminal 20 among the plurality of internal electrode layers 11 is also connected to the first wiring layer 43A in the same manner as the other internal electrode layers 11. In this case, the opening for connecting the uppermost electrode layer to the first wiring layer 43A is not provided in the capacitance portion 10. However, like the openings 30A and 30B in the via holes 14A and 14B, an opening 31 in which the first wiring layer 43A is laminated on a bottom surface and a side surface thereof is formed. Details of the openings 30 (30A and 30B) and the opening 31 will be described later.

The internal electrode layer 11 is formed of a material having conductivity. Specifically, a material containing nickel (Ni) or platinum (Pt) as a main component is suitably used for the internal electrode layer 11, and Ni is particularly preferably used. When a material containing Ni as a main component is used for the internal electrode layer 11, a content thereof is preferably 50% by mass or more with respect to the entire internal electrode layer 11. That is, the "main component" means that a proportion of the component is 50% by mass or more. Also, when the main component of the internal electrode layer 11 is Ni, at least one element (hereinafter, referred to as an "additional element") selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), and silver (Ag) is further contained. When the internal electrode layer 11 contains an additional element, disconnection of the internal electrode layer 11 can be inhibited. The internal electrode layer 11 may contain a plurality of additional elements. A thickness of the internal electrode layer 11 is, for example, about 10 nm to 1000 nm.

The base electrode layer 13 may be formed of the same conductive material as that of the internal electrode layer 11. A thickness of the base electrode layer 13 may be, for example, 5 μm or more and 100 μm or less.

The dielectric layer 12 is formed of a perovskite-based dielectric material. The perovskite-based dielectric material in the embodiment includes a dielectric (ferroelectric) material having a perovskite structure such as BaTiO$_3$ (barium titanate), (Ba$_{1-x}$Sr$_x$)TiO$_3$ (barium strontium titanate), (Ba$_{1-x}$Ca$_x$)TiO$_3$, PbTiO$_3$, Pb(Zr$_x$Ti$_{1-x}$)O$_3$ or the like, a complex perovskite relaxor type ferroelectric material represented by Pb(Mg$_{1/3}$Nb$_{2/3}$)O$_3$ or the like, a bismuth layered compound represented by Bi$_4$Ti$_3$O$_{12}$, SrBi$_2$Ta$_2$O$_9$ or the like, a tungsten bronze type ferroelectric material or the like represented by (Sr$_{1-x}$Ba$_x$)Nb$_2$O$_6$, PbNb$_2$O$_6$ or the like. Here, in the perovskite structure, the perovskite relaxor type ferroelectric material, the bismuth layered compound, and the tungsten bronze type ferroelectric material, a ratio between A sites and B sites is usually an integer ratio, but there may be intentional deviation from an integer ratio to improve characteristics. The dielectric layer 12 may appropriately contain an additive as an accessory component to control the characteristics of the dielectric layer 12. The dielectric layer 12 is baked, and a relative dielectric constant (εr) thereof is, for example, 100 or more. The relative dielectric constant of the dielectric layer 12 is preferably as large as possible, and an upper limit value thereof is not particularly limited. A thickness of the dielectric layer 12 is, for example, 10 nm to 1000 nm.

A electrode terminal 20 is a terminal for electrically connecting the thin film capacitor 1 to an external electronic component or the like (not shown). The electrode terminal 20 is laminated on the wiring portion 40 which will be described later. In the embodiment, the thin film capacitor 1 has a plurality of electrode terminals 20. In FIG. 1, only three electrode terminals 20A, 20B and 20C are shown.

In the material constituting the electrode terminal 20, nickel (Ni), copper (Cu), gold (Au), platinum (Pt), and an alloy containing these metals as a main component are preferable, and in particular, an alloy containing Cu as a main component is preferably used. The higher the purity of Cu constituting the electrode terminal 20 is, the better it is, and it is preferably 99.99% by mass or more. A small amount of impurities may be contained in the electrode terminal 20. Examples of impurities which can be contained in the electrode terminal 20 formed of an alloy containing Cu as a main component include transition metal elements such as iron (Fe), titanium (Ti), nickel (Ni), aluminum (Al), magnesium (Mg), manganese (Mn), silicon (Si) or chromium (Cr), vanadium (V), zinc (Zn), niobium (Nb), tantalum (Ta) yttrium (Y), lanthanum (La), cesium (Ce), or the like, or rare earth elements, chlorine (Cl), sulfur (S), phosphorus (P), and so on.

The wiring portion 40 is provided to cover a region in which the capacitance portion 10 is formed, and includes a first cover layer 41A, a second cover layer 41B, a first insulating layer 42A, a second insulating layer 42B, the first wiring layer 43A, and a second wiring layer 43B. The first insulating layer 42A and the second insulating layer 42B serve as insulating layers on the capacitance portion 10. The first wiring layer 43A and the second wiring layer 43B are wiring layers in the wiring portion 40. Incidentally, the first cover layer 41A and the second cover layer 41B may be collectively referred to as a cover layer 41.

The first cover layer 41A covers an upper surface of the capacitance portion 10. For example, the first cover layer 41A may be formed of the same material as the dielectric layer 12. A dielectric (ferroelectric) material having a perovskite structure such as BaTiO$_3$ (barium titanate), (Ba$_{1-x}$Sr$_x$)TiO$_3$ (barium strontium titanate), (Ba$_{1-x}$Ca$_x$)TiO$_3$, PbTiO$_3$, Pb(Zr$_x$Ti$_{1-x}$)O$_3$ or the like, a complex perovskite relaxor type ferroelectric material represented by Pb(Mg$_{1/3}$Nb$_{2/3}$)O$_3$ or the like, a bismuth layered compound represented by Bi$_4$Ti$_3$O$_{12}$, SrBi$_2$Ta$_2$O$_9$ or the like, or a tungsten bronze type ferroelectric material or the like represented by (Sr$_{1-x}$Ba$_x$)Nb$_2$O$_6$, PbNb$_2$O$_6$ or the like may be used as the first cover layer 41A. Since occurrence of stress between the first cover layer 41A and another layer (particularly, the dielectric layer 12 or the like) in contact with the first cover layer 41A can be suppressed by forming the first cover layer 41A of the same material as the dielectric layer 12, separation is suppressed, and as a result, an effect of increasing an electrostatic capacity or suppressing a leakage current is exerted. The material of the first cover layer 41A is not limited to the above-described materials, and for example, an inorganic material such as a silica (SiO$_2$), an alumina (Al$_2$O$_3$) and a silicon nitride (SiN), an organic material such as a polyimide, or an insulating material obtained by mixing or laminating these materials can be used. A thickness of the first cover layer 41A is, for example, about 10 nm to 1000 nm.

The second cover layer 41B is laminated on a surface of the first cover layer 41A. The second cover layer 41B is provided at a position overlapping the first cover layer 41A in a plan view. The second cover layer 41B is formed of an inorganic insulating material such as a silica (SiO$_2$), for example. A thickness of the second cover layer 41B is, for example, about 10 nm to 1000 nm.

It is not necessary that both the first cover layer 41A and the second cover layer 41B are laminated, and at least one of the first cover layer 41A and the second cover layer 41B may be provided.

The first insulating layer 42A covers the capacitance portion 10 in each region in which the capacitor is formed in the capacitance portion 10. The second insulating layer 42B covers a region in which the first insulating layer 42A is not formed and partially covers a periphery of the first insulating layer 42A. That is, the capacitance portion 10 is covered with a two-stage structure of the first insulating layer 42A and the second insulating layer 42B.

The first insulating layer 42A and the second insulating layer 42B are not particularly limited as long as they have insulating properties, and for example, a nonconductive resin such as polyimide, an inorganic material such as a silica (SiO$_2$), an alumina (Al$_2$O$_3$), and a silicon nitride (SiN), or an insulating material obtained by mixing or laminating these materials can be used. A thickness of the first insulating layer 42A is, for example, 0.5 μm or more and 10 μm or less, and a thickness of the second insulating layer 42B is, for example, 0.5 μm or more and 10 μm or less. The "thickness of the first insulating layer 42A" is a distance between an upper surface of the second cover layer 41B and an upper surface of the first insulating layer 42A. Further, the "thickness of the second insulating layer 42B" is a distance between the upper surface of the first insulating layer 42A and an upper surface of the second insulating layer 42B.

The first wiring layer 43A is formed along the upper surface of the first insulating layer 42 between the first insulating layer 42A and the second insulating layer 42B. The first wiring layer 43A extends in a vertical direction along the upper surface of the first insulating layer 42A and has a contact portion 44A, which is in contact with an exposed portion 15 of the internal electrode layer 11, at a lower end thereof. Also, the second wiring layer 43B is formed on the second insulating layer 42B along the upper surface of the second insulating layer 42B. The second wiring layer 43B extends in the vertical direction along the second insulating layer 42B and has a contact portion 44B, which is in contact with the first wiring layer 43A, at a lower end thereof. The electrode terminals 20A, 20B, and 20C are formed on the second wiring layer 43B.

The contact portion 44B of the second wiring layer 43B on which the electrode terminal 20A is formed is in contact with the first wiring layer 43A having a contact portion 44A which is in contact with the internal electrode layer 11A located closest to the base electrode layer 13 among the three internal electrode layers 11. The contact portion 44B of the second wiring layer 43B on which the electrode terminal 20B is formed is in contact with the first wiring layer 43A having the contact portion 44A which is in contact with the internal electrode layer 11B located at a center among the three internal electrode layers 11. The contact portion 44B of the second wiring layer 43B on which the electrode terminal 20C is formed is in contact with the first wiring layer 43A having the contact portion 44A which is in contact with the internal electrode layer 11C located closest to the electrode terminal 20 among the three internal electrode layers 11. In this way, the electrode terminals 20A, 20B and 20C are respectively electrically connected to the base electrode layer 13, the lower electrode layer of the internal electrode layers 11, and the upper electrode layer of the internal electrode layers 11 via the second wiring layer 43B and the first wiring layer 43A.

Figure 2:
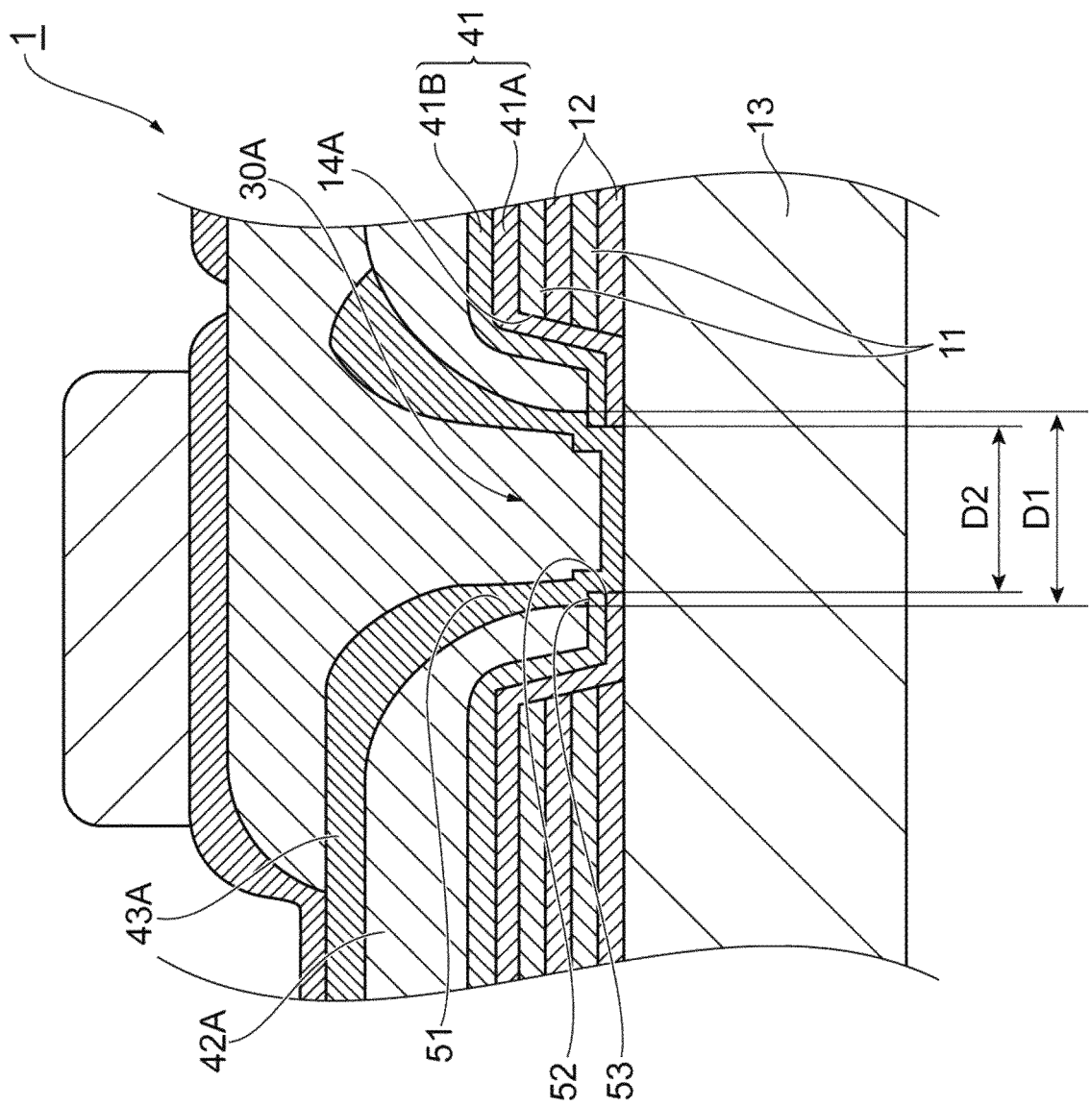
FIG. 2 is a view for explaining a method of manufacturing the thin film capacitor of FIG. 1.

The openings 30 (30A and 30B) and the opening 31 of the thin film capacitor 1 will be described with reference to FIG. 2. FIG. 2 is an enlarged view of a vicinity of the opening 30A. The opening 30A is formed inside the via hole 14A of the capacitance portion 10. The via holes 14 (14A and 14B) are formed to connect the electrode layer different from the uppermost electrode layer among the internal electrode layers 11, or the base electrode layer 13 to the electrode terminals 20. In the via hole 14, the electrode layer to be connected to the electrode terminals 20 is exposed at the bottom surface. The opening 30A is formed in the via hole 14A and is formed by combining two openings which are continuous in the laminating direction. That is, the opening 30A includes a first opening portion 51 which passes through the first insulating layer 42A, and a second opening portion 52 which is provided below the first opening portion 51 and passes through the cover layer 41 (the first cover layer 41A and the second cover layer 41B). In a plan view, the second opening portion 52 is disposed at a position overlapping the first opening portion 51. Further, the first opening portion 51 and the second opening portion 52 have different inner diameters, and assuming that the inner diameter of the first opening portion 51 is D1 and the inner diameter of the second opening portion 52 is D2, a relation D1>D2 is satisfied. Therefore, each of the openings 30A has a stepped portion 53 of which an inner diameter changes at a boundary between the first opening portion 51 and the second opening portion 52. In the stepped portion 53, a surface of the cover layer 41 (the second cover layer 41B on a side of the upper surface) is exposed.

Although only the opening 30A is shown in FIG. 2, like the opening 30A, each of the openings 30B and 31 may also be configured to include the first opening portion 51 and the second opening portion 52 which are continuous in the laminating direction. Also, assuming that the inner diameter of the first opening portion 51 is D1 and the inner diameter of the second opening portion 52 is D2, the relation D1>D2 is satisfied.

The inner diameter D1 of the first opening portion 51 may be, for example, about 5 μm to 30 μm. Further, the inner diameter D2 of the second opening portion 52 may be, for example, about 3 μm to 28 μm. Furthermore, it is preferable that the inner diameter D1 of the first opening portion 51 and the inner diameter D2 of the second opening portion 52 have a relationship in which D1/D2 is 1 to 4. Adhesion between the first wiring layer 43A and the base electrode layer 13 is further improved and a moisture resistance barrier effect is also secondarily improved by satisfying such a relationship.

Next, a manufacturing method of the thin film capacitor 1 will be described with reference to FIGS. 3A to 5B. FIGS. 3A to 5B are views for explaining the manufacturing method of the thin film capacitor shown in FIG. 1. FIGS. 3A to 5B are enlarged views showing a part of the thin film capacitor 1 in the middle of the manufacturing process. Actually, a plurality of thin film capacitors 1 are formed at one time, and then they are segmented into individual thin film capacitors 1.

Figure 3A:
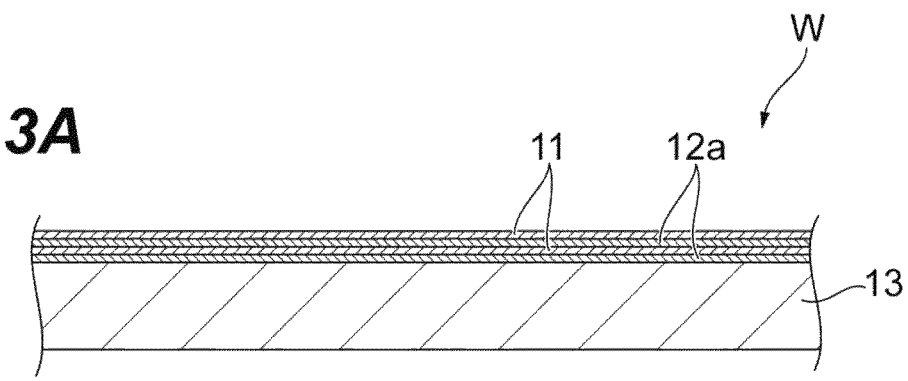
FIGS. 3A, 3B, 3C are views for explaining the method of manufacturing the thin film capacitor of FIG. 1.

First, as shown in FIG. 3A, the base electrode layer 13 is prepared, and a laminated body W is formed by alternately laminating the internal electrode layers 11 and dielectric films 12a which will be the dielectric layers 12 on the base electrode layer 13 (a lamination process). Due to this process, a portion which will be the capacitance portion 10 is formed. For example, DC sputtering or the like may be used as a method of forming the internal electrode layer 11. Also, as a method of forming the dielectric film 12a, a film forming technique such as a solution method, a physical vapor deposition (PVD) method like sputtering, or a chemical vapor deposition (CVD) method may be used, and for example, the sputtering method may be used.

Figure 3B:
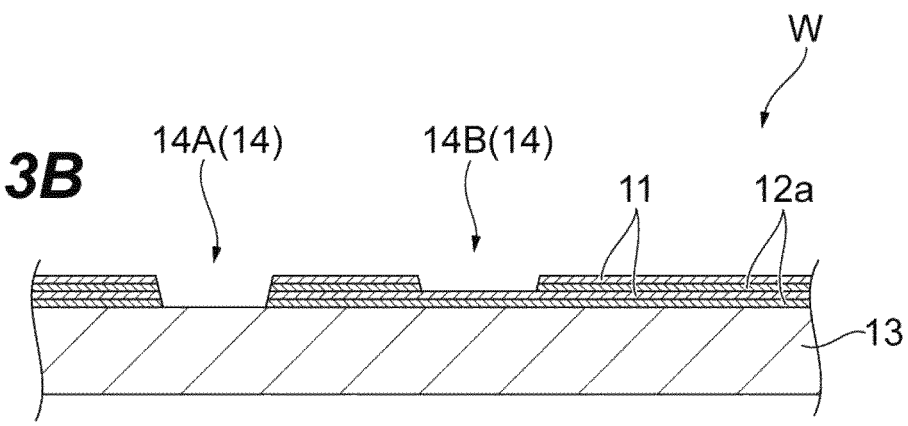

Next, as shown in FIG. 3B, the via holes 14 (via holes 14A and 14B) which pass through the internal electrode layers 11 and the dielectric films 12a are formed in the laminated body W (a via hole forming process). The via holes 14A and 14B are formed for the purpose of removing the internal electrode layer 11 and the dielectric film 12a at positions in which the openings 30A and 30B described later are formed. The formation of the via holes 14 is performed by, for example, dry etching or the like. In the thin film capacitor 1, the via hole 14 is provided corresponding to a position in which the first wiring layer 43A and the base electrode layer 13 or the internal electrode layer 11 are in contact with each other. Therefore, in the via holes 14, the electrode layer to be brought into contact with the first wiring layer 43A among the base electrode layer 13 and the plurality of internal electrode layers 11 is exposed on the bottom surface, and a continuous side surface is formed by an end surface of the internal electrode layer 11 above the electrode layer and an end surface of the dielectric film 12a. In the via hole 14A of the via holes 14 shown in FIG. 3B, the base electrode layer 13 is exposed, and a continuous side surface is formed by the end surfaces of the internal electrode layer 11 and the dielectric film 12a on the base electrode layer 13. Further, in the via hole 14B, the internal electrode layer 11 of the two internal electrode layers 11 on a side of the base electrode layer 13 is exposed at the bottom surface, and a continuous side surface is formed by the end surfaces of the internal electrode layer 11 and the dielectric film 12a thereabove.

Next, the first cover layer 41A is formed to cover the upper surfaces and the side surfaces (that is, the surfaces exposed at the surface) of the internal electrode layer 11, the dielectric layer 12, and the base electrode layer 13 (a protective layer forming process). The first cover layer 41A is formed to cover the entire upper surface of the laminated body W including the inside of the via holes 14A and 14B. The first cover layer 41A may be formed by, for example, a PVD method such as sputtering.

Thereafter, the laminated body W is baked (a baking process). Through this process, the dielectric film 12a is sintered, the dielectric layer 12 is formed, and the capacitance portion 10 is formed. In the case in which the first cover layer 41A is formed of the same dielectric material as the dielectric layer 12, the first cover layer 41A is also sintered simultaneously with the formation of the dielectric layer 12. For example, a temperature at the time of baking may be a temperature at which the dielectric film 12a is sintered (crystallized), specifically, about 800° C. to 1000° C. being preferable. Further, a baking time may be set to about 5 minutes to 2 hours. An atmosphere at the time of baking is not particularly limited and may be any of an oxidizing atmosphere, a reducing atmosphere and a neutral atmosphere, and it is possible to adopt a constitution in which the baking is performed at least at an oxygen partial pressure which does not oxidize the internal electrode layer 11.

Figure 3C:
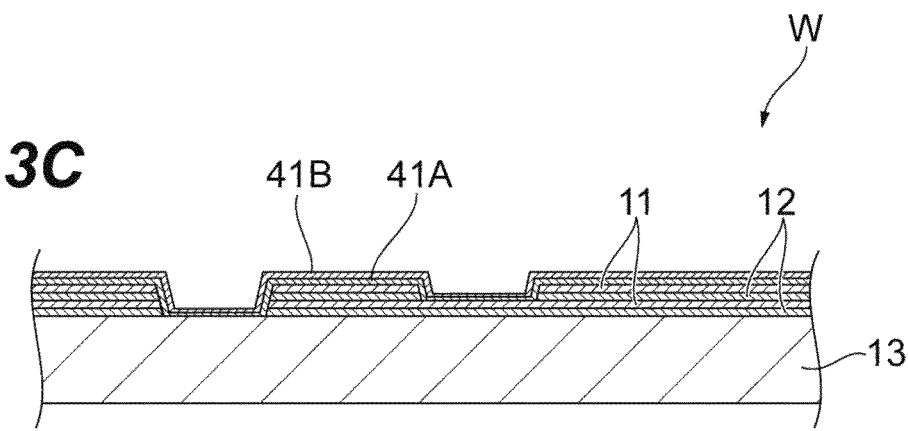

Thereafter, the second cover layer 41B is formed to cover the entire surface of the first cover layer 41A (a protective layer forming process). The second cover layer 41B may be formed by, for example, a PVD method such as sputtering. As a result, as shown in FIG. 3C, the capacitance portion 10 including the internal electrode layer 11, the dielectric layer 12, and the base electrode layer 13 is formed. The order of the baking of the laminated body W (the baking process) and the lamination of the cover layers 41 (the first cover layer 41A and the second cover layer 41B) (a part of a protective layer laminating process) may be appropriately changed.

Figure 4A:
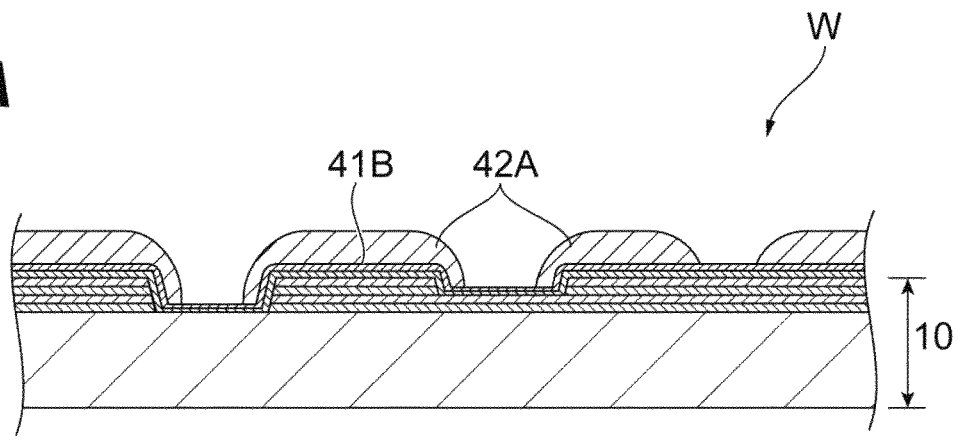
FIG. 4A, 4B are views for explaining the method of manufacturing the thin film capacitor of FIG. 1.

Next, as shown in FIG. 4A, the first insulating layer 42A is formed on the second cover layer 41B (the protective layer laminating process). The first insulating layer 42A is formed to cover the capacitance portion 10. The first insulating layer 42A is not formed in a region in which the contact portion with respect to the first wiring layer 43A is formed, like the openings 30A and 30B. Therefore, a region in which the first insulating layer 42A is not formed is also provided above a part of the surface of the upper internal electrode layer 11 to be connected to the electrode terminal 20C (refer to FIG. 1) (a position corresponding to the opening 31). The first insulating layer 42A is formed, for example, by applying a thermosetting resin in an uncured state and then heating and curing the applied thermosetting resin. Further, the first insulating layer 42A may be formed by applying a photocurable resin in an uncured state and then irradiating light of a specific wavelength to cure the photocurable resin. Also, the first insulating layer 42A may be formed by another method such as sputtering.

Figure 4B:
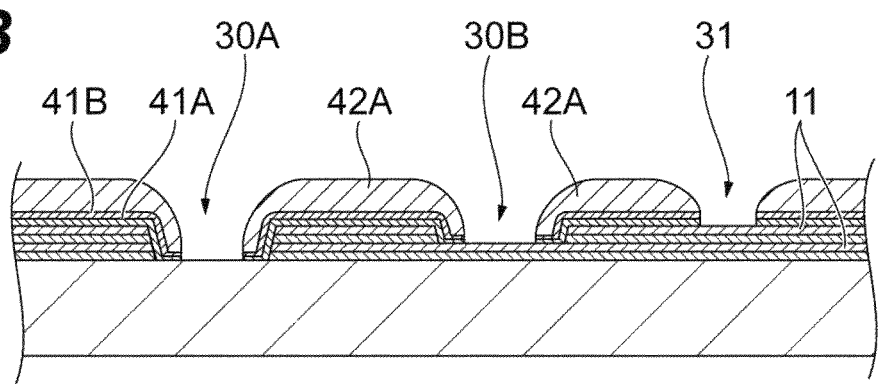

Next, as shown in FIG. 4B, the base electrode layer 13 or the internal electrode layer 11 is exposed to provide the first wiring layer 43A by dry etching or the like using the first insulating layer 42A as a mask (an opening forming process). Through this process, the openings 30A and 30B are formed in the via holes 14A and 14B, respectively, and the opening 31 is also formed in the upper surface of the upper internal electrode layer 11. At this stage, in the opening 30A, the base electrode layer 13 is exposed at the bottom surface, and a side surface in a state in which the first cover layer 41A, the second cover layer 41B, and the first insulating layer 42A are laminated in this order is formed. At this stage, the first cover layer 41A, the second cover layer 41B, and the first insulating layer 42A form a continuous surface on a side surface of the opening 30A. Further, in the opening 30B, the lower electrode layer of the internal electrode layers 11 is exposed on the bottom surface, and a side surface due to a continuous surface in a state in which the first cover layer 41A, the second cover layer 41B, and the first insulating layer 42A are laminated in this order is formed. Also, in the opening 31, the upper electrode layer of the internal electrode layers 11 is exposed on the bottom surface, and a side surface due to the continuous surface in the state in which the first cover layer 41A, the second cover layer 41B, and the first insulating layer 42A are laminated in this order is formed.

Figure 5A:
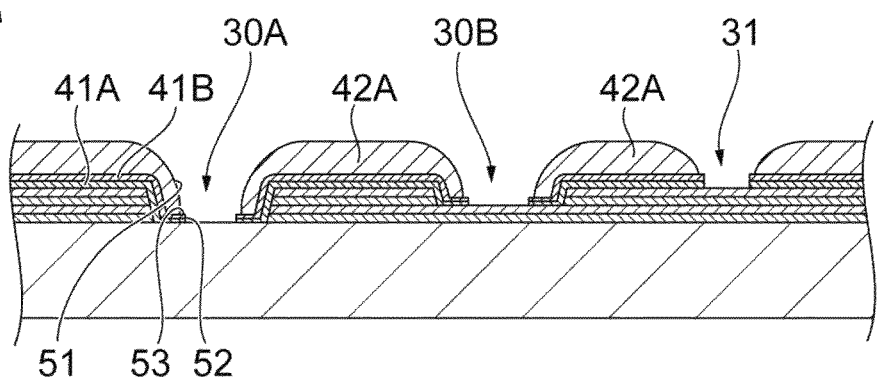
FIG. 5A, 5B are views for explaining the method of manufacturing the thin film capacitor of FIG. 1.

Next, as shown in FIG. 5A, a part of the first insulating layer 42A is removed by an ashing treatment (a surface treatment process). The ashing can be performed by, for example, plasma ashing using oxygen gas. Through this process, a surface layer of the first insulating layer 42A is totally removed. As a result, the first insulating layer 42A is retracted with respect to the first cover layer 41A and the second cover layer 41B on the respective side surfaces of the openings 30A and 30B and the opening 31. Therefore, the first opening portion 51 and the second opening portion 52 having different inner diameters from each other are formed in each of the openings 30A and 30B and the opening 31. Since the first insulating layer 42A is selectively retracted as described above, the inner diameter D1 of the first opening portion 51 is larger than the inner diameter D2 of the second opening portion 52 (refer to FIG. 2). In addition, the stepped portion 53 is formed between the first opening portion 51 and the second opening portion 52. The first opening portion 51 and the second opening portion 52 may be formed by removing the surface layer of the first insulating layer 42A using a method different from the ashing treatment.

Figure 5B:
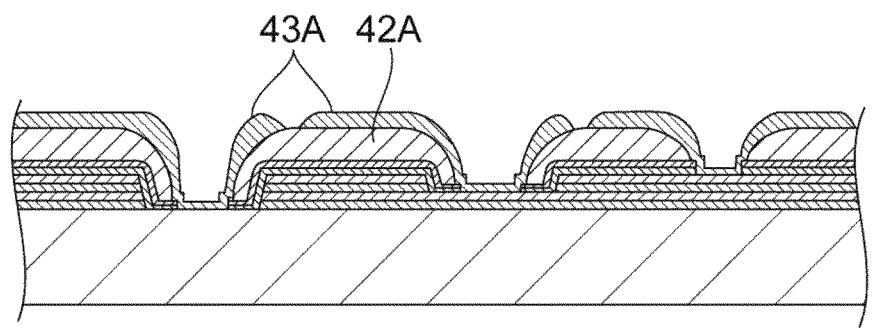

Next, as shown in FIG. 5B, the first wiring layer 43A is formed on the first insulating layer 42A. The first insulating layer 42A may be formed by, for example, applying a thermosetting resin in an uncured state, curing the applied thermosetting resin by heating or the like and then patterning it. Alternatively, the first insulating layer 42A may be formed by another method such as sputtering or the like. The first wiring layer 43A is formed by sputtering or evaporating a conductive material such as copper (Cu) and then patterning it by etching. Through this process, a plurality of first wiring layers 43A which are electrically independent from each other are formed, and the respective first wiring layers 43A are electrically connected to the base electrode layer 13 and the plurality of internal electrode layers 11.

The second insulating layer 42B is then formed on the first insulating layer 42A and the first wiring layer 43A. Additionally, the second wiring layer 43B is formed on the second insulating layer 42B. Like the first insulating layer 42A, the second insulating layer 42B is formed by, for example, applying a thermosetting resin in an uncured state, curing the applied thermosetting resin by heating or the like and then patterning it. Like the first wiring layer 43A, the second wiring layer 43B is formed by, for example, sputtering or evaporating a conductive material such as copper (Cu) and then patterning it by etching. Through this process, a plurality of second wiring layers 43B which are electrically independent from each other are formed. The respective second wiring layers 43B are electrically connected to the respective first wiring layers 43A, and the wiring portion 40 is formed.

Thereafter, the electrode terminals 20A, 20B and 20C for electrically connecting the thin film capacitor 1 to external electronic components are formed on the respective second wiring layers 43B. The electrode terminals 20A, 20B and 20C are formed by, for example, forming a layer of a conductive material such as copper (Cu) by plating or the like and then etching it or the like. Eventually, the thin film capacitor 1 shown in FIG. 1 is obtained by segmentation due to dicing or the like.

As described above, according to the thin film capacitor 1 and the manufacturing method of the thin film capacitor 1 according to the embodiment, in the openings 30 (the openings 30A and 30B) in which one electrode layer is exposed at the bottom surfaces thereof, the inner diameter D1 of the first opening portion 51 passing through the insulating layer and the inner diameter D2 of the second opening portion 52 provided below the first opening portion 51 and passing through the cover layer 41 satisfy the relationship of D1>D2. With such a configuration, it is possible to ensure a long path connecting the dielectric layer 12 included in the capacitance portion 10 covered by the cover layer 41 and the first insulating layer 42A laminated on an upper side of the cover layer 41.

The above-described features will be described with reference to FIG. 2. As shown in FIG. 2, the cover layers 41 including the first cover layer 41A and the second cover layer 41B are interposed between the first insulating layer 42A and the dielectric layer 12 of the capacitance portion 10. Therefore, when water or the like derived from unreacted products is generated in the first insulating layer 42A, in order for the water or the like to reach the dielectric layer 12, it is necessary to follow an interface between the first wiring layer 43A and the cover layer 41 and an interface between the cover layer 41 (the first cover layer 41A) and the base electrode layer 13. In this way, in the thin film capacitor 1, a long path which connects the first insulating layer 42A to the dielectric layer 12 is ensured.

Conventionally, providing the cover layer 41 between the first insulating layer 42A and the capacitance portion 10 in the thin film capacitor 1 has been studied. However, since there has been no idea of extending the path between the first insulating layer 42A and the capacitance portion 10 using the cover layer 41, when the via hole 14 is formed to provide a wiring, finely controlling a shape of the inside thereof has not been studied.

In contrast, in the thin film capacitor according to the embodiment, the opening 30 is formed from the first opening portion 51 passing through the first insulating layer 42A and the second opening portion 52 passing through the cover layer 41, and the inner diameter D2 of the second opening portion 52 is smaller than the inner diameter D1 of the first opening portion 51. With such a configuration, it is possible to lengthen the path which connects the first insulating layer 42A with the dielectric layer 12 of the capacitance portion 10 using the cover layer 41 covering the capacitance portion 10. Therefore, in the thin film capacitor 1, as compared to a conventional thin film capacitor 1, since water or the like can be prevented from entering the dielectric layer 12 even when water or the like derived from unreacted products is generated in the insulating layer (first insulating layer 42A), occurrence of capacitance reduction or the like can be prevented.

Further, in the thin film capacitor 1, the cover layer 41 has the first cover layer 41A and the second cover layer 41B laminated on the first cover layer 41A and formed of an inorganic insulating material. With such a configuration, the first cover layer 41A can enhance the adhesion to the internal capacitance portion, and the second cover layer 41B can ensure a long path between the first insulating layer 42A laminated on an upper side thereof and the dielectric layer 12 of the capacitance portion 10 on a lower side thereof. Therefore, performance deterioration of the capacitance portion due to the unreacted products contained in the first insulating layer 42A can be prevented, and damage of the thin film capacitor or the like around the cover layer can be appropriately prevented.

In the thin film capacitor 1, as a method of further extending the path connecting the first insulating layer 42A with the dielectric layer 12 of the capacitance portion 10, there is a method of making the inner diameter of the opening portion formed in the first cover layer 41A different from the inner diameter of the opening portion formed in the second cover layer 41B. The above-described modified example will be described with reference to FIG. 6.

Figure 6:
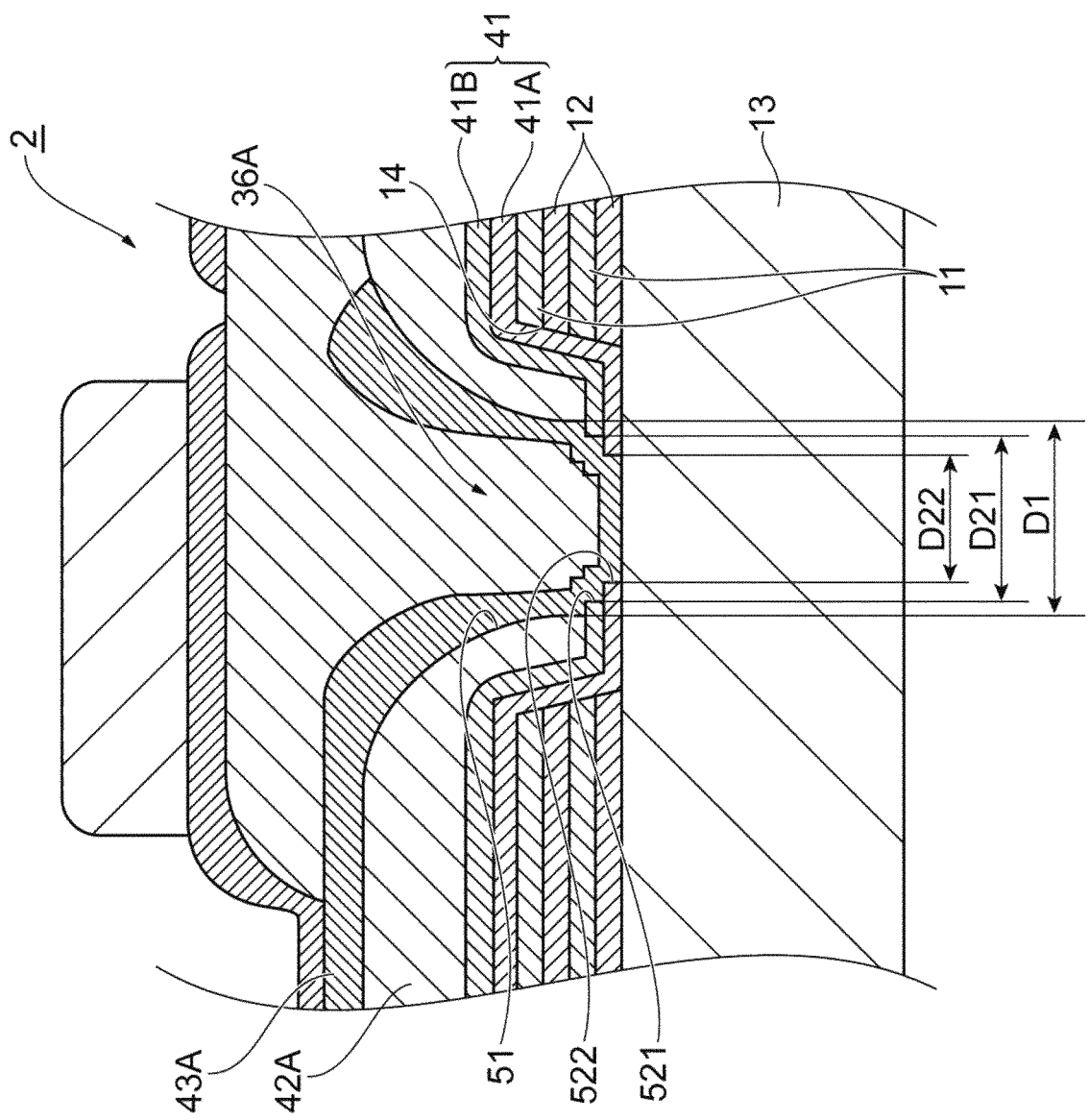
FIG. 6 is a cross-sectional view schematically showing a part of a thin film capacitor according to a modified example.

A thin film capacitor 2 according to a modified example shown in FIG. 6 is different from the thin film capacitor 1 of FIG. 2 in the following points. That is, the second opening portion 52 shown in FIG. 2 is configured by an upper opening portion 521 passing through the second cover layer 41B on the upper side and a lower opening portion 522 passing through the first cover layer 41A on the lower side. An inner diameter of the upper opening portion 521 and an inner diameter of the lower opening portion 522 are different from each other. Specifically, when the inner diameter of the upper opening portion 521 is D21 and the inner diameter of the lower opening portion 522 is D22, D1>D21>D22. In order to make the inner diameters of the upper opening portion 521 and the lower opening portion 522 different from each other, a method of delaying the progress of etching in the first cover layer 41A can be used, by controlling etching conditions or the like during a process of exposing the base electrode layer 13 or the internal electrode layer 11 by dry etching using the first insulating layer 42A as a mask (refer to FIG. 4B), but the present invention is not particularly limited thereto.

In the case of the shape shown in FIG. 6, a longer path between the first insulating layer 42A and the dielectric layer 12 of the capacitance portion 10 can be ensured. That is, since the path becomes long and the inner diameter D22 of the lower opening portion 522 becomes smaller by providing a step between the first opening portion 51 and the upper opening portion 521 and between the upper opening portion 521 and the lower opening portion 522, a path from the lower opening portion 522 to the capacitance portion 10 also becomes longer. As a result, it is possible to prevent performance deterioration of the capacitance portion 10 due to the unreacted products contained in the first insulating layer 42A.

Although the embodiment of the present invention has been described above, the present invention is not limited to the above-described embodiment, and various modifications can be made. For example, the case in which the capacitance portion 10 has two internal electrode layers 11, two dielectric layers 12, and the base electrode layer 13 has been described in the embodiment, but the number of layers of the internal electrode layer 11 and the dielectric layer 12 of the capacitance portion 10 is not particularly limited and can be arbitrarily changed. For example, the capacitance portion 10 may have only two internal electrode layers 11 and one dielectric layer 12 (one capacitor structure), or may have more internal electrode layers 11 and dielectric layers 12. Further, the shape of the wiring portion 40 above the first insulating layer 42A can be appropriately changed.

Further, instead of providing the base electrode layer 13, a capacitance portion in which the internal electrode layers and the dielectric layers are alternately laminated on the insulating base material may be provided.

Further, the number of layers of the cover layer 41 can also be arbitrarily changed. For example, three or more cover layers 41 may be provided, or only one cover layer 41 may be provided. However, when the cover layer 41 is a single layer, it is necessary that the cover layer 41 is formed of a material which does not permeate water or the like generated from the unreacted products contained in the insulating layer.

What is claimed is:

1. A thin film capacitor comprising:
a capacitance portion in which a plurality of electrode layers and dielectric layers are alternately laminated in a laminating direction;
a cover layer laminated on the capacitance portion to cover the capacitance portion;
an insulating layer laminated on the cover layer;
a via hole which extends in the laminating direction and in which one electrode layer different from an uppermost electrode layer among the plurality of electrode layers is exposed at a bottom surface thereof; and
an opening which extends in the laminating direction and is provided inside the via hole and has a smaller diameter that the via hole, and a wiring layer is formed on a bottom surface of the opening and a side surface of the opening, and in which the one electrode layer is exposed at the bottom surface of the opening, and in which the cover layer and the insulating layer laminated on the one electrode layer are exposed at the side surface of the opening in this order and the capacitance portion is not exposed on the side surface of the opening,
wherein the opening includes a first opening portion which passes through the insulating layer and a second opening portion which is provided below the first opening portion and passes through the cover layer, and when an inner diameter of the first opening portion is D1 and an inner diameter of the second opening portion is D2, D1>D2.

2. The thin film capacitor according to claim 1,
wherein the cover layer includes a first cover layer, and a second cover layer formed of an inorganic insulating material and laminated on the first cover layer.

3. The thin film capacitor according to claim 2,
wherein the second opening portion includes an upper opening portion which passes through the second cover layer and a lower opening portion which passes through the first cover layer, and
when an inner diameter of the upper opening portion is D21 and an inner diameter of the lower opening portion is D22, D1>D21>D22.

4. The thin film capacitor according to claim 2,
wherein the first cover layer is formed of the same material as the dielectric layer.

5. The thin film capacitor according to claim 1,
wherein the opening has a stepped portion of which an inner diameter changes at a boundary between the first opening portion and the second opening portion.

* * * * *